United States Patent
Lau et al.

(10) Patent No.: US 12,268,018 B2
(45) Date of Patent: Apr. 1, 2025

(54) GaN VERTICAL TRENCH MOSFETs AND METHODS OF MANUFACTURING THE SAME

(71) Applicant: The Hong Kong University of Science and Technology, Hong Kong (CN)

(72) Inventors: Kei May Lau, Hong Kong (CN); Renqiang Zhu, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 499 days.

(21) Appl. No.: 17/650,531

(22) Filed: Feb. 10, 2022

(65) Prior Publication Data
US 2022/0399460 A1    Dec. 15, 2022

Related U.S. Application Data

(60) Provisional application No. 63/209,409, filed on Jun. 11, 2021.

(51) Int. Cl.
*H10D 30/66*    (2025.01)
*H10D 30/01*    (2025.01)
(Continued)

(52) U.S. Cl.
CPC ....... *H10D 30/668* (2025.01); *H10D 30/0297* (2025.01); *H10D 62/8503* (2025.01); *H10D 64/513* (2025.01)

(58) Field of Classification Search
CPC ............. H01L 29/7813; H01L 29/2003; H01L 29/4236; H01L 29/66734; H01L 29/0696;
(Continued)

(56) References Cited

U.S. PATENT DOCUMENTS 7,977,193 B1 * 7/2011 Disney ................. H10D 30/668
                                                           257/E29.257
9,799,652 B1   10/2017 Feilchenfeld et al.
(Continued)

FOREIGN PATENT DOCUMENTS

TW          I422033 B      1/2014

OTHER PUBLICATIONS

First Office Action of TW111109781 issued from the Taiwan Intellectual Property Office on Jun. 6, 2023.
(Continued)

*Primary Examiner* — Fernando L Toledo
*Assistant Examiner* — Marshall Mu-Nuo Hatfield
(74) *Attorney, Agent, or Firm* — S&F/WEHRW

(57) ABSTRACT

GaN vertical trench MOSFETs and methods of manufacturing the same are disclosed. One example embodiment is a vertical trench MOSFET. The MOSFET includes a semiconductor transistor that has a first surface and a second surface, and a trench that extends from the first surface into the semiconductor transistor along a first direction perpendicular to the first and second surfaces. The semiconductor transistor includes a body region having a channel region arranged along the first direction along at least a portion of a wall of the trench. The doping concentration of the channel region is non-uniform. As a non-limiting example, two-step doping is conducted for forming asymmetric or non-uniform channel of a GaN vertical trench MOSFET. In some embodiments, multiple-step doping other than the two-step doing (such as doping in three steps, four steps, or more), linearly scaled doping, other proper asymmetric doping can be used.

13 Claims, 8 Drawing Sheets

(51) Int. Cl.
*H10D 62/85* (2025.01)
*H10D 64/27* (2025.01)

(58) Field of Classification Search
CPC .......... H01L 29/41766; H01L 29/1095; H01L 29/1041; H01L 29/66522
See application file for complete search history.

(56) References Cited

U.S. PATENT DOCUMENTS

| | | | |
|---|---|---|---|
| 10,903,352 B2 | 1/2021 | Takashima et al. | |
| 2018/0061934 A1 | 3/2018 | Ueno | |
| 2018/0097069 A1* | 4/2018 | Utsumi | H10D 12/031 |
| 2018/0097081 A1 | 4/2018 | Cao et al. | |
| 2020/0105925 A1* | 4/2020 | Arthur | A23B 11/753 |
| 2020/0243656 A1* | 7/2020 | Shibib | H01L 29/407 |
| 2020/0266109 A1* | 8/2020 | Toyoda | H10D 84/038 |
| 2020/0273988 A1* | 8/2020 | Ina | H10D 62/8503 |
| 2022/0020851 A1* | 1/2022 | Venkatraman | H01L 29/0878 |

OTHER PUBLICATIONS

R. Zhu, H. Jiang, C. W. Tang and K. M. Lau, "Effects of p-GaN Body Doping Concentration on the ON-State Performance of Vertical GaN Trench MOSFETs," IEEE Electron Device Letters, 42 (7), 970-973, 2021.

C. Liu, R. Abdul Khadar, and E. Matioli, "GaN-on-Si Quasi-Vertical Power MOSFETs," IEEE Electron Device Letters, 39(1), 71-74, 2018.

Y. Zhang, M. Sun, J. Perozek, Z. Liu, A. Zubair, D. Piedra, N. Chowdhury, X. Gao, K. Shepard, and T. Palacios, "Large-Area 1.2-kV GaN Vertical Power FinFETs With a Record Switching Figure of Merit," in IEEE Electron Device Letters, 40(1), 75-78, 2019.

* cited by examiner

GaN VERTICAL TRENCH MOSFETs AND METHODS OF MANUFACTURING THE SAME

CROSS-REFERENCE TO RELATED APPLICATIONS

This application claims priority to U.S. provisional patent application Ser. No. 63/209,409, filed Jun. 11, 2021, entitled "Normally-off GaN vertical trench power MOSFETs with asymmetric channel doping," hereby incorporated herein by reference as to its entirety.

FIELD OF THE INVENTION

The present invention relates to semiconductor devices, and more particularly to gallium nitride (GaN) vertical trench MOSFETs.

BACKGROUND

GaN semiconductor devices, such as GaN metal-oxide-semiconductor field-effect transistors (MOSFETs) have demonstrated great promise for low and medium voltage power switching applications. However, existing commercial lateral GaN semiconductor devices suffer from certain issues, such as false switching and limited package density, etc. In this regard, vertical structure has been proposed to improve performance, such as voltage rating and current handling capability. However, the device performance is still unsatisfactory in many aspects.

New design in device structures and manufacturing methods that assist in advancing technological needs and industrial applications in GaN vertical structure semiconductor devices are desirable.

SUMMARY

One example embodiment is a GaN vertical trench MOSFET. The MOSFET includes a semiconductor transistor that has a first surface and a second surface, and a trench that extends from the first surface into the semiconductor transistor along a first direction perpendicular to the first and second surfaces. The semiconductor transistor includes a body region having a channel region arranged along the first direction along at least a portion of a wall of the trench. The doping concentration of the channel region is non-uniform. According to some embodiments, two-step doping is conducted for forming asymmetric or non-uniform channel of a GaN vertical trench MOSFET. This is non-limiting and for illustrative purpose only. In some other embodiments, multiple-step doping other than the two-step doping (such as doping in three steps, four steps, or more), linearly scaled doping, other proper asymmetric doping can be used.

Other example embodiments are discussed herein.

DETAILED DESCRIPTION

Figure 1A:
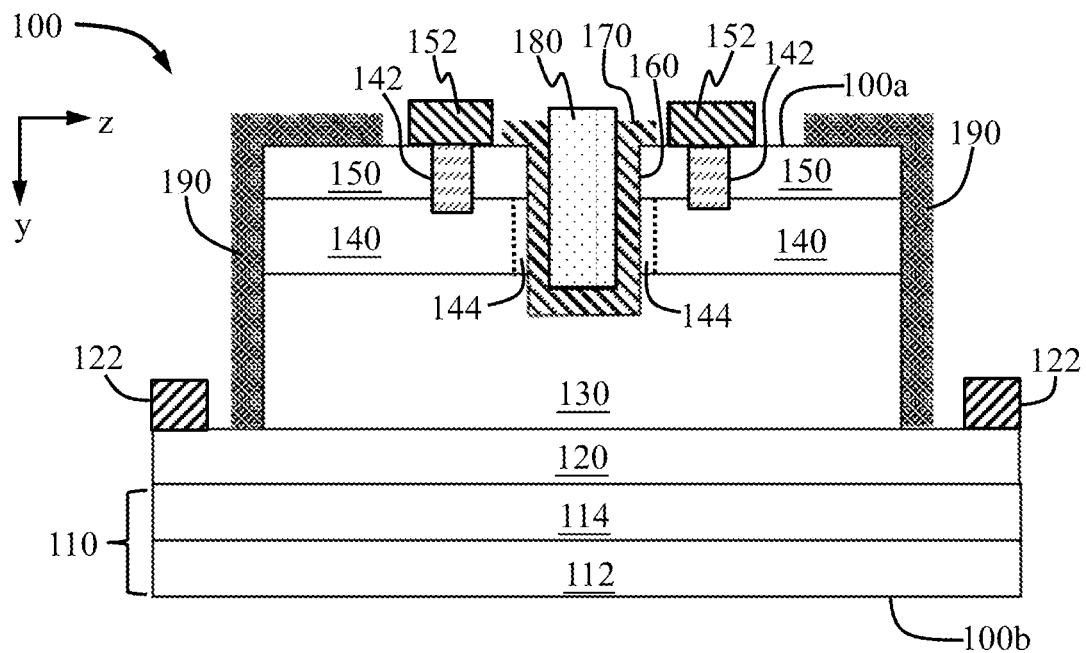
FIG. 1A is a schematic view illustrating a cross section of a GaN vertical trench MOSFET in accordance with certain example embodiments.

Example embodiments relate to GaN vertical trench MOSFETs with improved device performance and methods for manufacturing such MOSFETs.

Many existing GaN vertical MOSFETs are unsatisfactory in device performance in various aspects. For example, the ON-state performance including ON-resistance ($R_{ON}$) and ON-current ($I_{ON}$) are not on par with that of current aperture vertical electron transistors (CAVET) and vertical finFETs, which, as recognized by the present inventors, is mainly because of large channel resistance of the inversion channel layer in the trench MOSFETs. CAVETs and vertical FinFETs are at disadvantages in that they require complicated fabrication process (such as channel regrowth or precise dry etching) and have relatively small threshold voltage ($V_{th}$) (typically around 1-2 V) resulted from accumulation-mode operation. This hinders their adoption for high-voltage switching applications.

Example embodiments solve one or more of these problems associated with the existing vertical devices and provide technical solutions with new structural designs. Example embodiments recognize influence of channel doping profile on the overall device performance. According to one or more embodiments, lower channel doping can increase ON-current and reduce ON-resistance, but at a cost of reduced threshold voltage. The reduced threshold voltage may result in false switching and therefore is not desirable in applications that require high speed. A higher channel doping can increase threshold voltage, but the ON-current will be sacrificed. Example embodiments recognize the difficulties of achieving satisfaction in all electrical parameters. There may be a tradeoff. Such tradeoff, however, as further recognized by example embodiments as presented herein, would be difficult to be achieved by uniform channel doping.

Example embodiments improve the overall device performance by providing GaN vertical trench MOSFETs with non-uniform or asymmetric channel doping. The present inventors have recognized that by simply controlling or tailoring channel doping profiles, an improved tradeoff between electrical parameters, such as ON-current, ON-resistance and threshold voltage, can be achieved. According to one or more embodiments, a GaN vertical trench MOSFET is provided. The MOSFET includes a semiconductor transistor that has a first surface and a second surface, and a trench that extends from the first surface into the semiconductor transistor along a first direction perpendicular to the first and second surfaces. The semiconductor transistor includes a body region having a channel region arranged along the first direction along at least a portion of a wall of the trench. The doping concentration of the channel region is non-uniform. For example, the doping concentration of the channel region can vary along the first direction. The doping concentration can vary linearly or non-linearly along the first direction. The varying doping profiles can be achieved by multi-step doping, such as two-step doping, three-step-doping, etc. According to one or more embodiments, manufacturing of vertical trench MOSFETs is desirable. For example, the doping can be controlled during epilayer growth. No implementation or regrowth process is needed in the whole device fabrication. This is preferred for manufacture in many scenarios.

FIG. 1A is a schematic view illustrating a cross section of a GaN vertical trench MOSFET 100 in accordance with certain example embodiments. The MOSFET 100 can be a vertical trench MOSFET that employs one or more inventive concepts as described herein according to one or more embodiments.

As illustrated, the MOSFET 100 includes a base 110, a first epilayer 120 disposed on the base 100, and a second epilayer 130 disposed on the first epilayer 120.

The base 110 can include one or more layers. By way of example, the base 110 includes a substrate 112 and a buffer layer 114. The substrate 112 can be made from or include GaN, silicon (Si), Sapphire, silicon carbide (SiC), or the like. The buffer layer 114 is disposed on the substrate 114 and in the present embodiment, includes GaN with proper doping or being undoped.

The first epilayer 120 is of a first conductivity type and has a first doping concentration. By way of example, the first epilayer 120 includes GaN doped with n-type dopants, such as Si, and has the first doping concentration at $1E18$ $cm^{-3}$ (i.e., $1 \times 10^{18}$ $cm^{-3}$) or higher The second epilayer 130 is of the first conductivity type and has a second doping concentration that is lower than the first doping concentration. By way of example, the second epilayer 130 is a drift layer and includes GaN doped with N-type dopants, such as Si, and has the second doping concentration at $1E17$ $cm^{-3}$ or lower.

As illustrated, the MOSFET 100 further includes a body region 140 disposed on the second epilayer 130 and a source region 150 disposed on the body region 140. A trench 160 extends through the source region 150 and the body region 140 along a first direction (i.e. y direction in FIG. 1) and into the second epilayer 130.

The body region 140 has a second conductivity type opposite to the first conductivity type. By way of example, the body region 140 includes GaN and is doped with p-type dopants such as being selected from a group consisting of magnesium (Mg), calcium (Ca), beryllium (Be), and zinc (Zn). For example, the body region 140 can be doped with Mg with the doping concentration at around $1E17$ $cm^{-3}$ or higher.

In the present embodiment as illustrated, the source region 150 includes GaN and is doped with the first conductivity type, such as n-type. For example, the source region 150 can be doped with Si at a doping concentration of $1E18$ $cm^{-3}$ or higher. Generally at least some portions of the source region 150 are heavily doped to form Ohmic contact with source metals for better electrical connection.

The body region 140 electrically connects to external circuits or control through a body contact 142, such as Ni/Al metal stack or other proper conductive materials or their combination. The source region 150 electrically connects to external circuits or control through a source contact 152, such as Ti/Al/Ni/Au metal stack or other proper conductive materials or their combination. In the present embodiment as illustrated, the body contact 142 is electrically connected to the source contact 152.

The trench 160 defines an internal space or cavity for receiving gate materials. By way of example, gate dielectric 170, such as aluminum oxide ($Al_2O_3$), with a proper thickness (such as tens of nanometers) is deposited on the inner wall of the trench 160. Gate contact 180, such as Ti/Al metal stack or other proper conductive materials or their combination, is filled in the remaining space of the trench 160. A mesa is formed such that a drain contact 122 is disposed on the first epilayer 120. The source contact 152, the drain contact 122, and the gate contact 180 are three key terminals for the MOSFET 100. As also illustrated, a passivation layer 190 is provided for protection.

In the body region 140, a channel region 144 is formed vertically (i.e. along the y direction) along a portion of a wall of the trench 160. Specific configuration of the channel region 144 can be dependent on many factors, such as whether the MOSFET 100 is normally-on or normally-off, voltage signals applied to the gate contact 180, the potential difference between the source contact 152 and the drain contact 122, etc. For example, for a normally-off MOSFET, the channel region becomes conductive only when a proper gate voltage is applied.

In the present embodiment, the base 110, the first epilayer 120, the second epilayer 130, the body region 140, and the source region 150 essentially constitute a semiconductor transistor. The semiconductor transistor has a first surface 100a and a second surface 100b. Both surfaces are perpendicular to the first direction (i.e. y direction) and are in parallel with z direction.

Each of the first epilayer 120, the second epilayer 130, the body region 140, and the source region 150 can be grown by using molecular beam epitaxy (MBE), metal organic chemical vapor deposition (MOCVD). In some embodiments, one or more of such layers may be grown by atomic layer deposition (ALD).

The body region 140 has a great influence on device performance of the MOSFET 100. As recognized by the present inventors, the doping profile (such as doping concentration, distribution, etc.) is one important factor that affects electrical parameters of the MOSFET 100, such as maximum drain current ($I_{D, max}$), $R_{ON}$, and $V_{th}$. The present inventors have recognized that by properly tailoring the doping profile in the body region 140, accordingly the channel region 144, improved device performance can be achieved. In one or more embodiments, the body region is formed by epitaxial growth, and the body region is doped by dopant diffusion. Thus, along the y direction, the channel doping profile is substantially same as the doping profile of the body region. In this sense, the channel doping profile or concentration may be interchangeably used with the doping profile or concentration in the body region.

By way of example, the doping concentration of the channel can be $1E17$ $cm^{-3}$ or higher. The doping profile can be tailored in varies ways. By way of example, the doping concentration of the channel region can vary along the first direction (i.e., the y direction). The doping concentration can vary linearly or non-linearly along the first direction. Other options of doping variations are also possible.

Figure 1B:
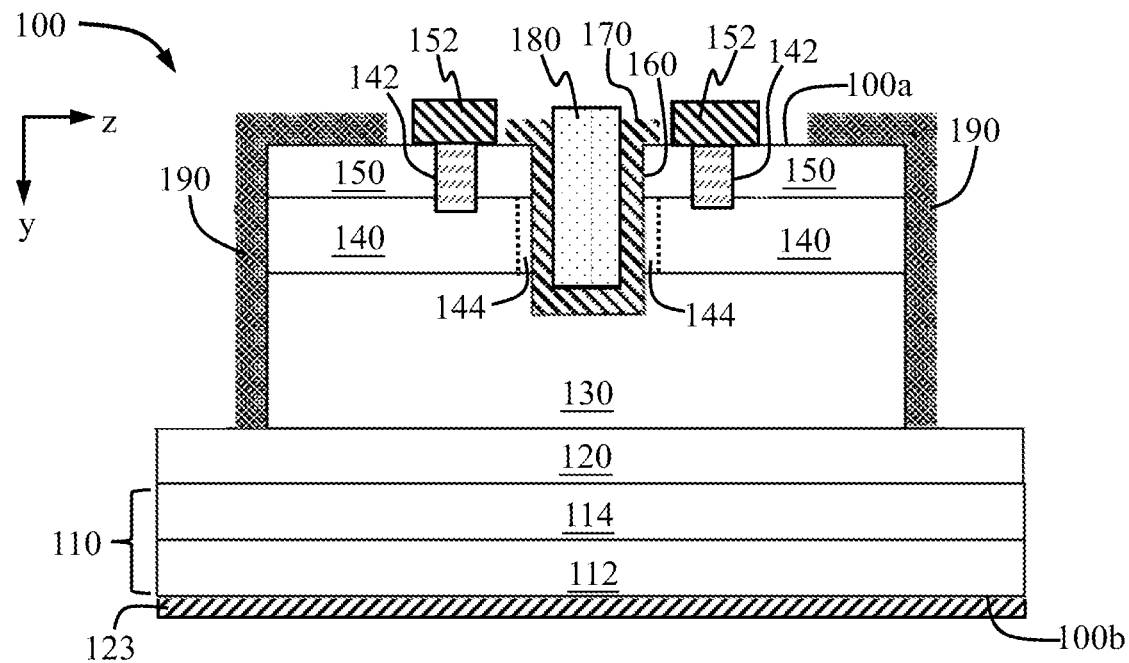
FIG. 1B is a schematic view illustrating a variation of the GaN vertical trench MOSFET of FIG. 1A.

FIG. 1B is a schematic view illustrating a variation of the GaN vertical trench MOSFET of FIG. 1A. The difference between the structures in FIGS. 1A and 1B is the arrangement of the drain contact. In FIG. 1A, the drain contact 122 is disposed on the first epilayer 120 (such as an n+ GaN layer). In this sense, the GaN vertical trench MOSFET in FIG. 1A can be considered as having a quasi-vertical structure. In FIG. 1B, when substrate 112 and buffer layer 114 are both conductive, the drain contact 123 as shown can be disposed on the second surface 100b. That is, the drain contact 123 is arranged on the back-side of the substrate 112. The drain contact 123 is thus also called a back-side drain contact. In this sense, the GaN vertical trench MOSFET in FIG. 1B can be considered as having a fully-vertical structure.

Figure 2:
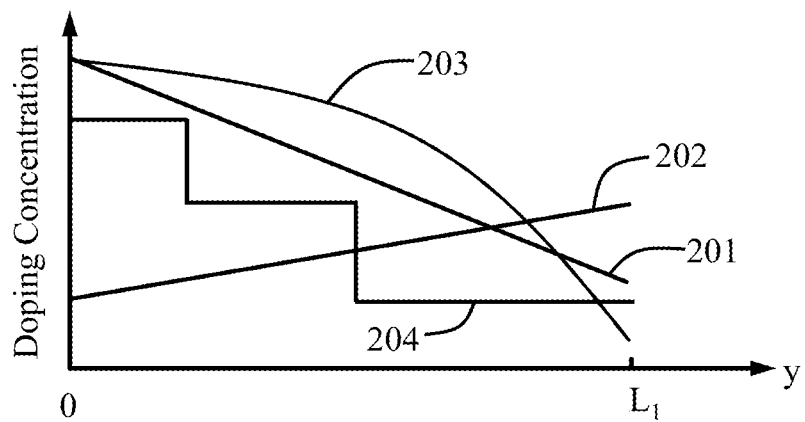
FIG. 2 illustrates different channel doping profiles in accordance with certain example embodiments.

FIG. 2 illustrates different channel doping profiles in accordance with certain example embodiments. As illustrated, the abscissa axis y indicates vertical direction, which for example, can be same as the y direction with reference to FIG. 1. The body region or channel region starts at point 0 and ends at point $L_1$. The vertical axis indicates illustrative doping concentration.

Curve 201 illustrates a doping profile that decreases linearly along the y direction. Curve 202 illustrates a doping profile that increases linearly along the y direction. Curve 203 illustrates a doping profile that decreases in a non-linear manner along the y direction. Curve 204 illustrates a doping profile that decreases in a stepwise manner. These curves are for illustrative purpose. Those skilled in the art would conceive of other variations regarding varying channel doping profiles after reading the present disclosure.

Figure 3A:
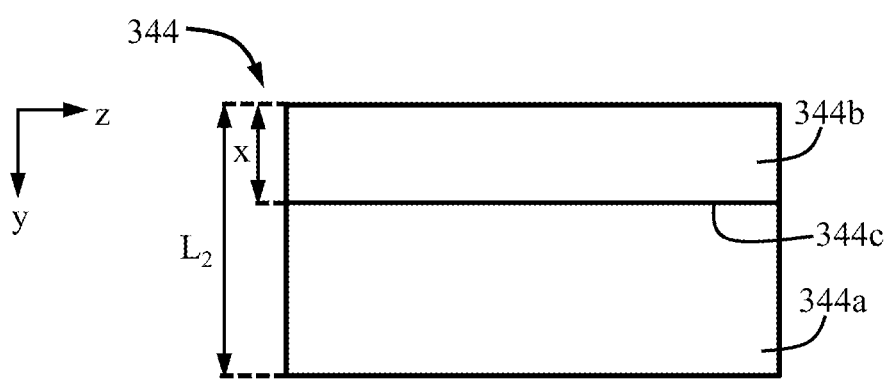
FIG. 3A illustrates a two-step channel doping in accordance with certain example embodiments.

FIG. 3A illustrates a two-step channel doping in accordance with certain example embodiments. The two-step channel doping can be a specific implementation for channel doping for the MOSFET 100 with reference to FIG. 1A or FIG. 1B.

For clarity, FIG. 3A shows a channel region 344 only. The channel region 344 extends vertically along the y direction. That is, conductive carriers (such as electrons) moves vertically when the MOSFET is in operation. The channel length along the y direction is denoted by $L_2$. The channel region 344 is doped non-uniformly or asymmetrically to achieve improved device performance.

In the present embodiments, the channel region 344 includes a first portion 344a and a second portion 344b. The first portion 344a has a length of ($L_2$-x) along the y direction while the second portion 344b has a length of x along the y direction. In the MOSFET, the second portion 344b can be closer to a source region, and sandwiched between the source region and the first portion 344a. The first portion 344a has an interface 344c with the second portion 344b. The interface 344c can be a plane in parallel with the z direction. In reality, the interface 344c may be a transition region. The doping concentration of the first portion 344a is uniform across the first portion 344a. The doping concentration of the second portion 344b is uniform across the second portion 344b. The doping concentration of the second portion 344b can be greater than the doping concentration of the first portion 344a. For example, the channel region 344 can be doped with Mg with a doping concentration at 1E17 $cm^{-3}$ or higher where the doping concentration of the second portion 344b is greater than the doping concentration of the first portion 344a.

Figure 3B:
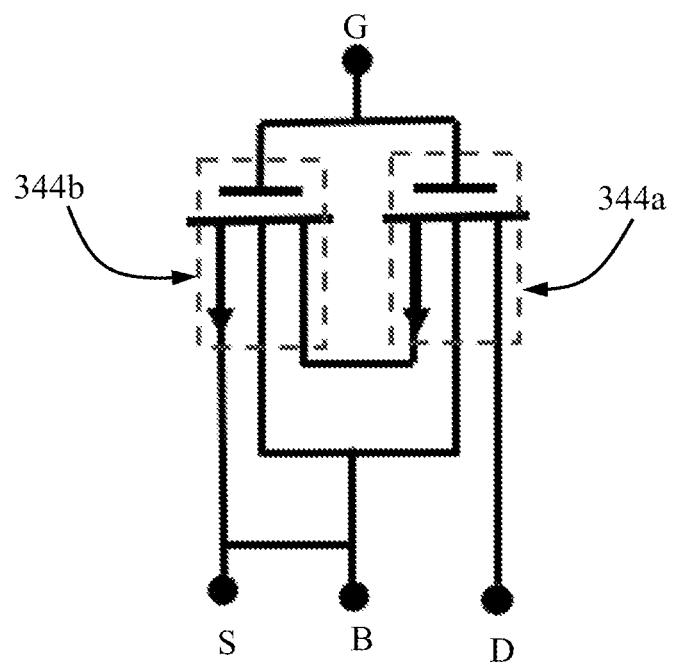
FIG. 3B illustrates an equivalent two-transistor model for the two-step doped channel of FIG. 3A.

FIG. 3B illustrates an equivalent two-transistor model for the two-step doped channel of FIG. 3A. The transistor has a gate terminal (denoted by G), a source terminal (denoted by S), a drain terminal (denoted by D), and a body terminal (denoted by B). The S terminal and the B terminal are electrically connected. Due to the two-step doping profile, the channel consists of a low doping channel 344a (corresponding to the first portion) and a high doping channel 344b (corresponding to the second portion). An increased channel doping concentration increases the threshold voltage of MOSFET. As a result, the high doping channel 344b can be used to tune the threshold voltage, such as improving the threshold voltage to a certain level to avoid or mitigate false switching of the MOSFET, thereby contributing to high-speed applications. That is, by combination of high doping and lower doping in the channel region, a desirable threshold voltage can be achieved without sacrificing one or more other electrical parameters, thereby improving the overall device performance.

Figure 4A:
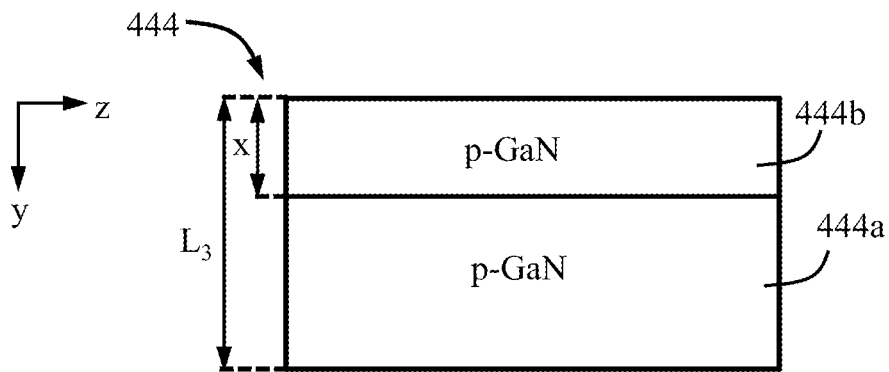
FIG. 4A illustrates channel doping options for five samples (#A, #B, #C, #D, and #E) for GaN vertical trench MOSFET in accordance with certain example embodiments.

FIG. 4A illustrates channel doping options for five samples (#A, #B, #C, #C, and #D) for GaN-based vertical trench MOSFET in accordance with an example embodiment. The channel region 444 as illustrated can be a specific implementation of channel region 144 with reference to FIG. 1A or FIG. 1B or channel region 344 with reference to FIG. 3A. For clarity, FIG. 4A illustrates channel region 444 only and omits other elements of the vertical trench MOSFET including the channel region 444.

In the present embodiment, the substrate includes sapphire. The buffer layer is i-GaN, which is an undoped GaN layer. The first epilayer is a 1 micrometer (μm) thick n+-GaN layer doped with Si at a concentration of around 5E18 $cm^{-3}$. The second epilayer is 2.5 μm thick n--GaN layer doped with Si at a concentration of around 5E16 $cm^{-3}$. The body region is a GaN layer doped with Mg (That is, the body region is p-GaN where the word "p" means p-type) and including the channel region 444. The source region is a 200 nanometer (nm) thick n+-GaN layer doped with Si at a concentration of around 5E18 $cm^{-3}$. The gate dielectric is a 50 nm thick $Al_2O_3$. The source contact includes Ti/Al/Ni/Au. The drain contact includes Ti/Al/Ni/Au. The gate contact includes Ti/Al. The passivation layer includes $Al_2O_3$ with a thickness of 50 nm.

The five samples (i.e. #A, #B, #C, #D, and #E) are diffident in their doping profiles in the channel region 444. As the channel region is formed in the body region and the body region is formed by epitaxial growth, the doping profiles for the body region and the channel region are substantially the same. The length $L_3$ of the channel region is 400 nm. For sample #A, the channel region 444 is uniformly doped with Mg at a concentration of 2.3E19 $cm^{-3}$. For sample #B, the channel region 444 is uniformly doped with Mg at a concentration of 1.8E19 $cm^{-3}$. For sample #C, the channel region 444 is uniformly doped with Mg at a concentration of 1.2E19 $cm^{-3}$. For sample #D and #E, the channel region 444 is formed with two-step doping. The channel region 444 includes a first portion with a length of ($L_3$-x) and a second portion with a length of x along they direction. The first and second portions are doped differently. Specifically, for sample #D, the first portion 444a has a length of 300 nm and concentration of 1.2E19 $cm^{-3}$. The second portion 444b has a length of 100 nm and concentration of 2.3E19 $cm^{-3}$. For sample #E, the first portion 444a has a length of 350 nm and concentration of 1.2E19 $cm^{-3}$. The second portion 444b has a length of 50 nm and concentration of 2.3E19 $cm^{-3}$. For both sample #D and #E, the high doping channel is closer to the source region.

Figure 4B:
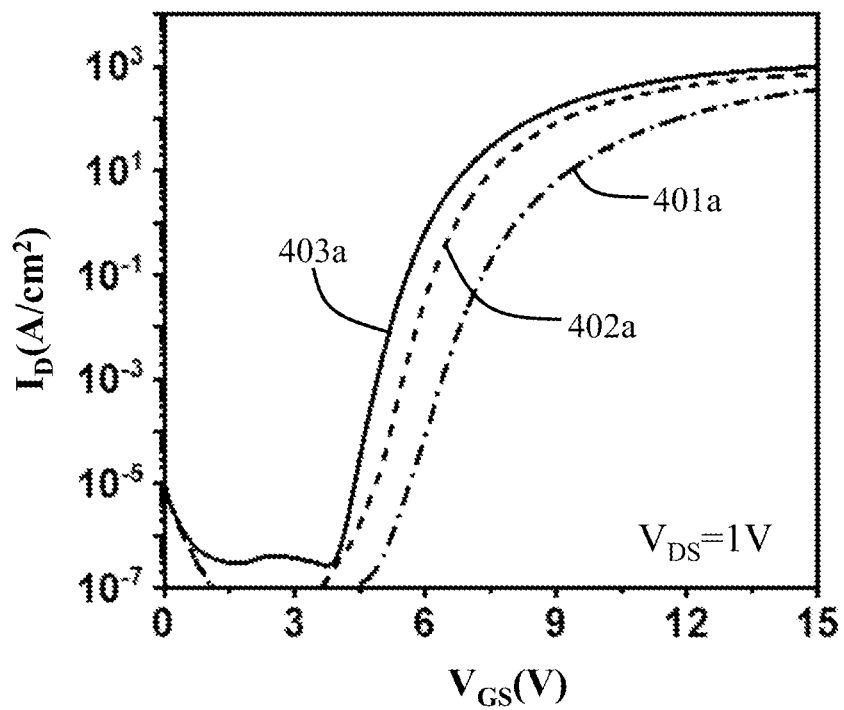
FIG. 4B illustrates experimental $I_D$-$V_{GS}$ curves for samples #A, #B and #C of FIG. 4A.
Figure 4C:
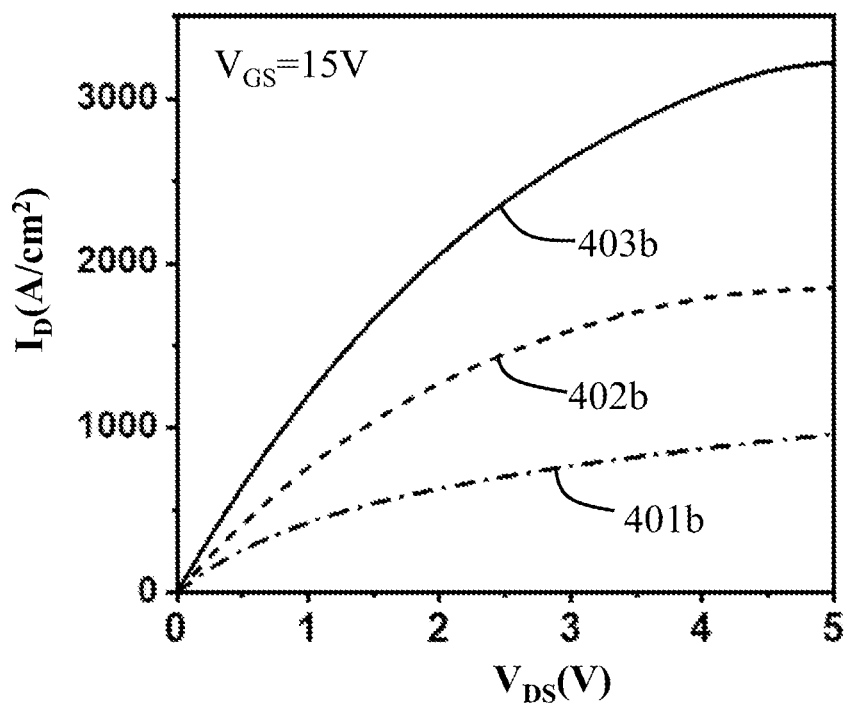
FIG. 4C illustrates experimental $I_D$-$V_{DS}$ curves for samples #A, #B and #C of FIG. 4A.
Figure 4D:
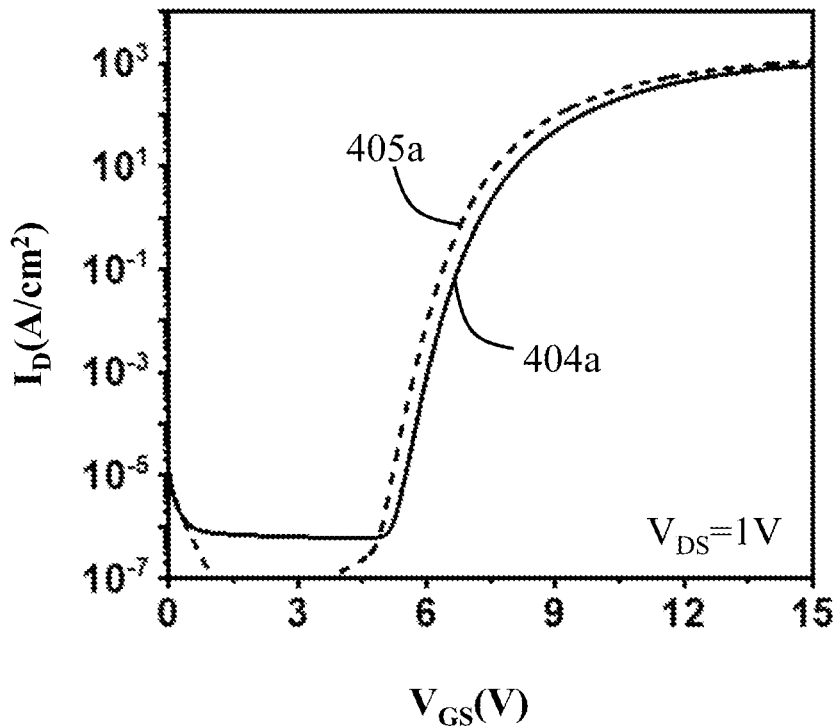
FIG. 4D illustrates experimental $I_D$-$V_{GS}$ curves for samples #D and #E of FIG. 4A.
Figure 4E:
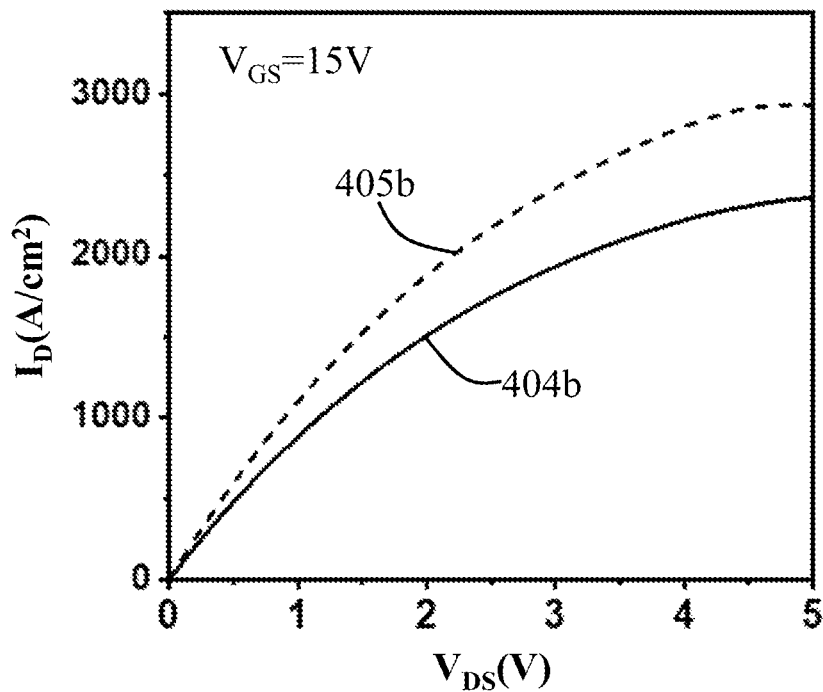
FIG. 4E illustrates experimental $I_D$-$V_{DS}$ curves for samples #D and #E of FIG. 4A.

FIGS. 4B-4G shows some device performance for the five samples. FIGS. 4B and 4D illustrates experimental $I_D$-$V_{GS}$ curves. FIGS. 4C and 4E illustrates experimental $I_D$-$V_{DS}$ curves.

In FIG. 4B, the curves 401a, 402a, and 403a correspond to samples #A, #B, and #C respectively. As shown, sample #C, which has the lowest doping concentration, has the smallest threshold voltage. In FIG. 4C, the curves 401b, 402b, and 403b correspond to samples #A, #B, and #C respectively. As shown, sample #C, which has the lowest doping concentration, has the largest ON-current under a same gate voltage and lowest ON-resistance. In FIG. 4D, the curves 404a and 405a correspond to samples #D and #E respectively. In FIG. 4E, the curves 404b and 405b correspond to samples #D and #E respectively.

As shown, sample #D has a larger threshold voltage, larger ON-resistance, and smaller ON-current compared with those of sample #E. This is because sample #D has a lager second portion than that of the sample #E, and therefore a longer high doping channel along the y direction. As a whole, the channel region of sample #D is more heavily doped compared with sample #E. This indicates by tailoring doping profiles (such as concentration distribution, size ratios of high doping channel over low doping channel, etc.) in the channel region, electrical parameters can be adjusted and improved device performance can be obtained.

Further, compared with samples #A, #B, and #C, the $I_D$-$V_{GS}$ curves of samples #D and #E shift rightward. That means the threshold voltages increase for samples #D and #E. However, samples #D and #E do not show obvious sacrifice of ON-current and ON-resistance. That is, with non-uniform doping, the overall device performance is improved.

Figure 4F:
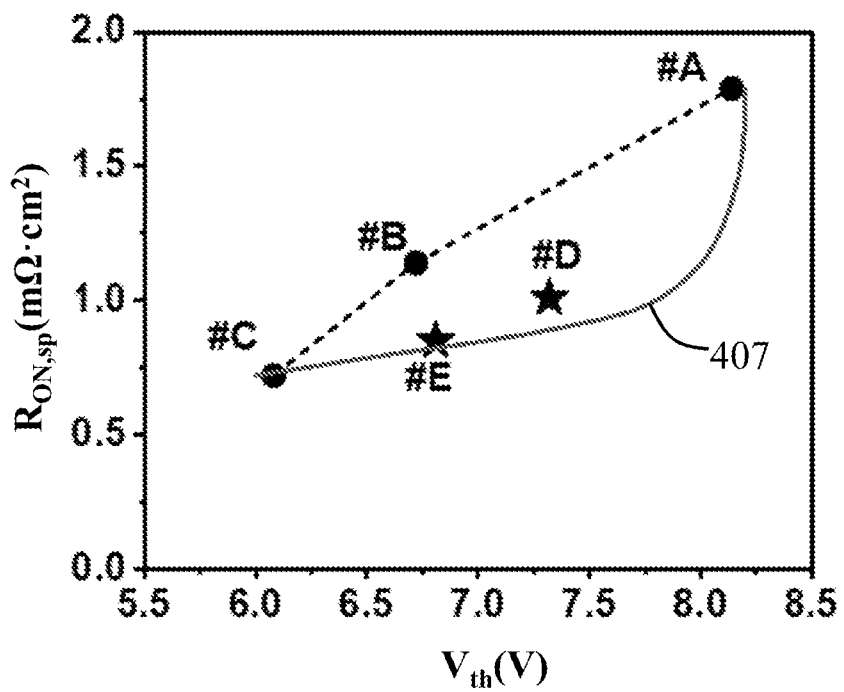
FIG. 4F illustrates $R_{ON,sp}$-$V_{th}$ relationship of the experimental results for the five samples of FIG. 4A and a semi-empirical model for two-step channel doping.
Figure 4G:
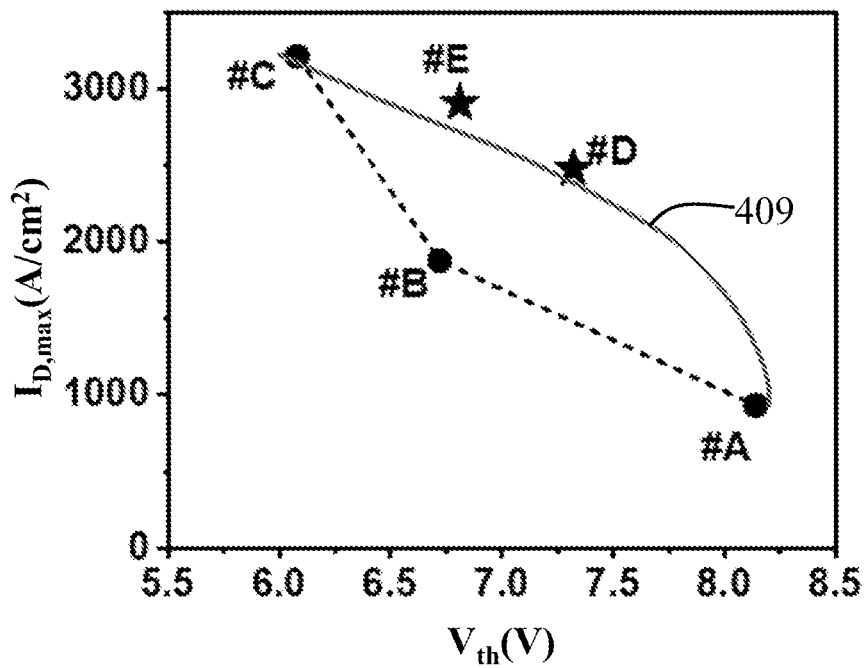
FIG. 4G illustrates $I_{D,max}$-$V_{th}$ relationship of the experimental results for the five samples of FIG. 4A and a semi-empirical model for two-step channel doping.

FIG. 4F illustrates specific ON-resistance ($R_{ON,sp}$)-$V_{th}$ relationship of the experimental results for the five samples of FIG. 4A and a semi-empirical model for two-step channel doping. FIG. 4G illustrates maximum ON-current ($I_{D,max}$) –$V_{th}$ relationship of the experimental results for the five samples of FIG. 4A and a semi-empirical model for two-step channel doping. The curves 407 and 409 are obtained by using the known Silvaco TCAD simulation solutions. Some key parameters (such as channel mobility, effective channel doping concentrations, etc.) used in the simulator are derived from fitting of the experimental results of MOSFETs for samples #A and #C. As shown, samples #D and #E, with a non-uniform channel doping, achieve improved tradeoff for electrical parameters such as maximum ON-current, specific ON-resistance, and threshold voltage, and accordingly improved overall device performance.

Figure 5:
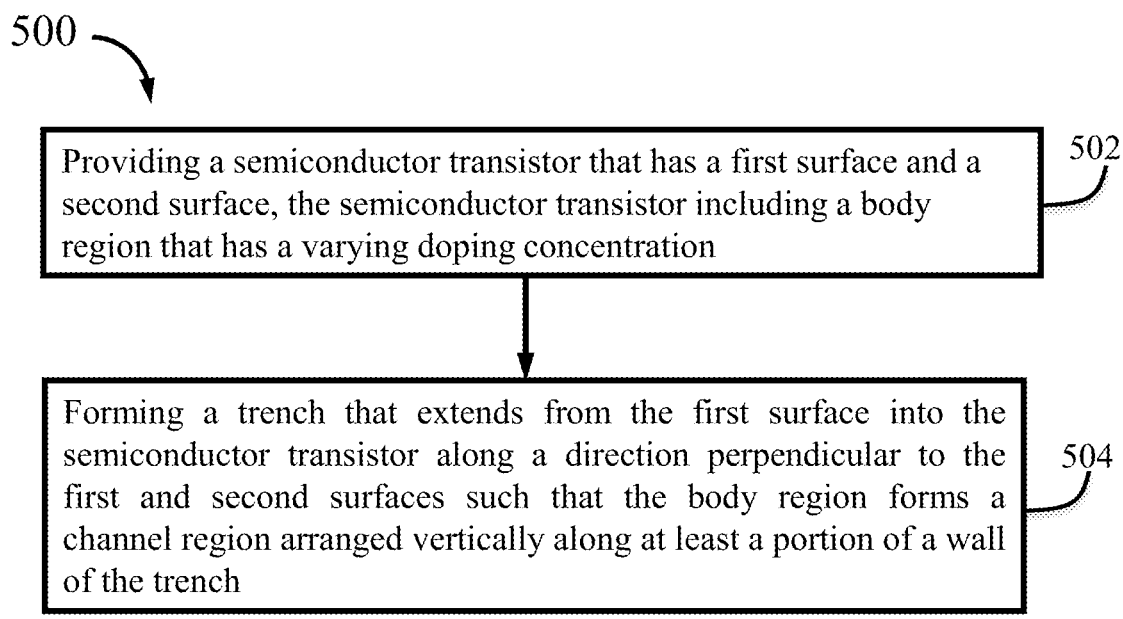
FIG. 5 illustrates a method of manufacturing a GaN vertical trench MOSFET in accordance with certain example embodiments.

FIG. 5 illustrates a method 500 of manufacturing a vertical trench MOSFET in accordance with certain example embodiments. The method 500, for example, can be used to make one or more vertical trench MOSFET as described above with reference to one or more figures.

Block 502 states providing a semiconductor transistor that has a first surface and a second surface. The semiconductor transistor includes a body region that has a varying doping concentration.

By way of example, the semiconductor transistor can include multiple layers or regions. The semiconductor transistor can include semiconductor materials such as one or more of GaN, Si, SiC, etc. In some embodiments, to provide the semiconductor transistor, a substrate is provided. A buffer layer of a first conductivity type is formed on the substrate. A first epilayer of the first conductivity type is formed on the buffer layer, where the first epilayer has a first doping concentration. A second epilayer of the first conductivity type is formed on the first epilayer, where the second epilayer has a second doping concentration that is less than the first doping concentration. The body region of a second conductivity type is disposed on the second epilayer. A source region of the first conductivity type is disposed on the body region. By way of example, the buffer layer, the first epilayer, the second epilayer, the body region, and the source region can be grown by using molecular beam epitaxy or metal organic chemical vapor deposition.

When growing the body region, the doping is controlled and tailored so that the doping profile is non-uniform or asymmetric for the body region and accordingly for the channel region. The doping profile can vary along a direction from the source region toward the substrate. The doping profile can be decreasing or increasing linearly or non-linearly (such as in a stepwise manner). The doping can be conducted in multi-steps, such as in two-steps, three-steps, or more.

Block 504 states forming a trench that extends from the first surface into the semiconductor transistor along a direction perpendicular to the first and second surfaces such that the body region forms a channel region arranged vertically along at least a portion of a wall of the trench.

By way of example, the trench can be formed by dry etching with proper masks that protect areas that are not to be etched. Inductively coupled plasma (ICP) etching, reactive-ion etching (RIE), or the like can be used to perform the dry etching. The body region can be activated followed by depositing gate dielectric. The gate dielectric can include one or more of $SiO_2$, $Al_2O_3$, $Si_xN_y$, $ZrO_2$, $HfO_2$ or combination thereof. The gate dielectric can be deposited by using one or more of atomic layer deposition (ALD), metal organic chemical vapor deposition (MOCVD), plasma-enhanced chemical vapor deposition (PECVD), low pressure chemical vapor deposition (LPCVD), sputtering, and the like. Contact metals are formed and passivation is performed to provide protection. The passivation layers can include one or more of $SiO_2$, $Al_2O_3$, $Si_xN_y$, or combination thereof. The passivation layer can be deposited by using one or more of ALD, MOCVD, PECVD, LPCVD, sputtering, and the like.

When manufacturing a vertical trench MOSFET according to one or more embodiments, the present inventors have recognized some key technical obstacles that need to be overcome. For example, the doped impurities for GaN, unlike that in Si layers by ion implantation, are difficult to control (such as migration, activation, etc.) to form a desirable profile. If the impurities are not sufficiently activated, device performance will be compromised. To address these problems, according to certain embodiments, high temperature (such as greater than 600° C.) annealing is used for p-GaN activation. As-grown p-GaN is passivated by hydrogen. The annealing is carried out by exposing the buried p-GaN via etched gate trench.

Figure 6:
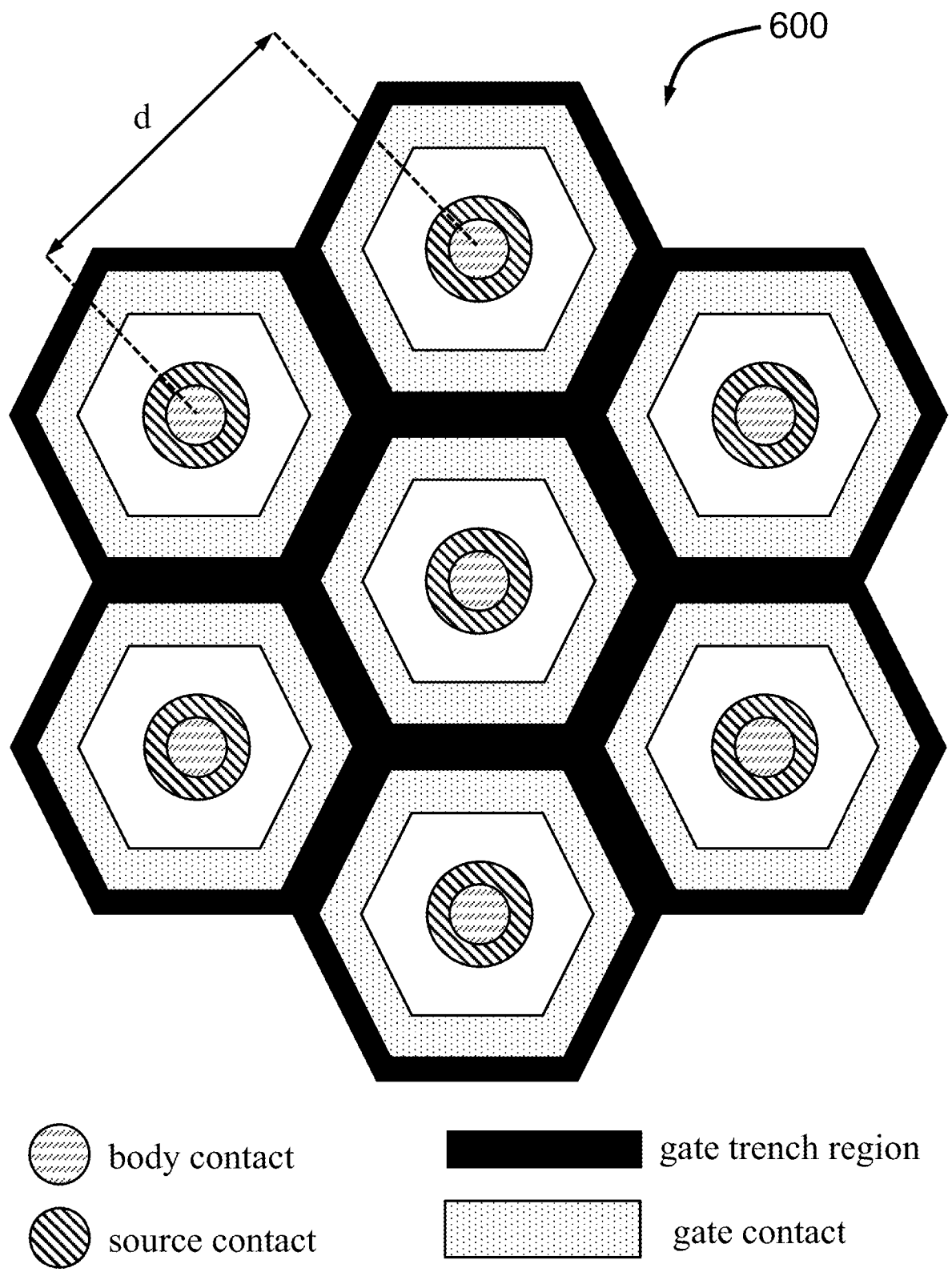
FIG. 6 is a schematic view illustrating a top view of a hexagonal vertical MOSFET structure including multiple cells with each cell including a GaN vertical trench MOSFET in accordance with certain example embodiments.

FIG. 6 is a schematic view illustrating a top view of a hexagonal vertical MOSFET (HEXFET) structure 600 including multiple cells with each cell including a GaN vertical trench MOSFET in accordance with certain example embodiments. As illustrated, each cell includes a body contact, a source contact, a gate contact, and a gate trench region. The body contact is placed in the center region of the cell while the gate trench region is disposed at the edge region of the cell and bordering adjacent cells.

The HEXFET structure 600 is designed by combing with one or more of the asymmetric channel doping as stated above. For example, the HEXFET structure 600 can include two or more GaN vertical trench MOSFETs as described above according to one or more embodiments. The cells (accordingly the multiple GaN vertical trench MOSFETs) can be connected in parallel to achieve high current, thereby enabling high current or high power applications. Depending on practical needs, the HEXFET structure 600 can include proper number of cells. The HEXFET structure 600 as illustrated has seven cells. This is for illustrative purpose only. Less or more than seven cells can be included.

The distance between neighboring cells can vary depending on practical needs. By way of example, a distance (d) between centers of neighboring cells can be in a range from 1 μm to 100 μm, such as 5-30 μm, 20-70 μm, 40-90 μm. Definition of the distance (d) is illustrated in FIG. 6. The HEXFET structure 600 can achieve a compact structure that helps improve device dentistry and reduce chip size.

As used herein, the term "uniform doping" means the doping concentration is substantially same. Statement that doping profile or concentration in a region or layer is uniform, or the like, means the doping concentration is substantially the same across the region or layer.

As used herein, the terms "non-uniform doping" and "asymmetric doping" are interchangeably used. Statement that a doping profile or concentration in a region or layer is non-uniform, not uniform, asymmetric, or the like means the doping concentration is not same across the region or layer to such an extent that one or more device parameters will be substantially affected.

Unless otherwise defined, the technical and scientific terms used herein have the plain meanings as commonly understood by those skill in the art to which the example embodiments pertain. Embodiments are illustrated in non-limiting examples. Based on the above disclosed embodiments, various modifications that can be conceived of by those skilled in the art fall within scope of the example embodiments.

What is claimed is:

1. A GaN vertical trench MOSFET comprising a semiconductor transistor that has a first surface and a second surface, and a trench that extends from the first surface into the semiconductor transistor along a first direction perpendicular to the first and second surfaces, wherein the semiconductor transistor includes a body region having a channel region arranged along the first direction along at least a portion of a wall of the trench, and wherein a doping concentration of the channel region is non-uniform,
wherein the channel region includes a first portion and a second portion having an interface with the first portion, the interface being in parallel with the first and second surfaces, the doping concentration of the first portion being uniform across the first portion, the doping concentration of the second portion being uniform across the second portion, the doping concentration of the second portion being greater than the doping concentration of the first portion,
wherein the semiconductor transistor comprises a source region, and the source region is disposed on the body region and comprises the first surface,
wherein the second portion is sandwiched between the source region and the first portion,
wherein the first portion and the second portion are doped with a same type of dopants.

2. The GaN vertical trench MOSFET of claim 1, wherein the doping concentration of the channel region varies along the first direction.

3. The GaN vertical trench MOSFET of claim 1, wherein the channel region is doped with Mg having a doping concentration not less than 1E17 cm$^{-3}$.

4. A GaN vertical trench MOSFET comprising:
a semiconductor transistor, the semiconductor transistor having a first surface and a second surface and comprising:
a base comprising the second surface;
a first epilayer of a first conductivity type that is disposed on the base and has a first doping concentration;
a second epilayer of the first conductivity type that is disposed on the first epilayer and has a second doping concentration, the first doping concentration being greater than the second doping concentration;
a body region of a second conductivity type that is disposed on the second epilayer, the second conductivity type being opposite to the first conductivity type; and
a source region that is disposed on the body region and comprises the first surface; and
a trench that extends through the source region and the body region and into the second epilayer, the trench extending from the first surface into the semiconductor transistor along a first direction perpendicular to the first and second surface,
wherein each of the first epilayer, the second epilayer, the body region, and the source region includes GaN,
wherein the body region has a channel region arranged along the first direction along at least a portion of a wall of the trench, the channel region comprising a plurality of channel portions, and wherein a doping concentration of the channel region is non-uniform,
wherein the body region has a varying doping concentration such that two or more channel portions are formed in the body region with different electrical parameters,
wherein the channel region includes a first portion and a second portion having an interface with the first portion, the interface being in parallel with the first and second surfaces, the doping concentration of the first portion being uniform across the first portion, the doping concentration of the second portion being uniform across the second portion, the doping concentration of the second portion being greater than the doping concentration of the first portion,
wherein the second portion is sandwiched between the source region and the first portion,
wherein the first portion and the second portion are doped with a same type of dopants.

5. The GaN vertical trench MOSFET of claim 4, wherein the electrical parameters include one or more of maximum drain current, specific ON-resistance, and threshold voltage.

6. The GaN vertical trench MOSFET of claim 4, wherein the doping concentration of the body region decreases along a direction from the source region towards the base.

7. The GaN vertical trench MOSFET of claim 4, wherein the doping concentration of the body region varies in a non-linear manner along a direction from the source region towards the base.

8. The GaN vertical trench MOSFET of claim 4, wherein the doping concentration of the body region is not less than 1E17 cm$^{-3}$.

9. The GaN vertical trench MOSFET of claim 4, wherein the body region is doped with Mg having a doping concentration not less than 1E17 cm$^{-3}$.

10. The GaN vertical trench MOSFET of claim 4, wherein the base includes a substrate and a buffer layer, the substrate including one or more of GaN, Si, Sapphire, and SiC, the buffer layer being disposed on the substrate and including GaN.

11. The GaN vertical trench MOSFET of claim 4, wherein the first conductivity type is n-type and the second conductivity type is p-type.

12. A hexagonal vertical MOSFET structure comprising a plurality of cells with each cell including a GaN vertical trench MOSFET according to claim 1.

13. The hexagonal vertical MOSFET structure of claim 12, wherein the plurality of cells are connected in parallel, and wherein a distance between centers of neighboring cells is in a range from 1 µm to 100 µm.

* * * * *